US009646928B2

(12) United States Patent
Wu et al.

(10) Patent No.: US 9,646,928 B2
(45) Date of Patent: May 9, 2017

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Jiun Yi Wu, Zhongli (TW); Hsueh-Lung Cheng, Hsinchu (TW); Shou-Yi Wang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 179 days.

(21) Appl. No.: 14/208,310

(22) Filed: Mar. 13, 2014

(65) Prior Publication Data

US 2015/0262933 A1    Sep. 17, 2015

(51) Int. Cl.
*H01L 23/48*    (2006.01)
*H01L 23/52*    (2006.01)
(Continued)

(52) U.S. Cl.
CPC .......... *H01L 23/5226* (2013.01); *H01L 22/32* (2013.01); *H01L 23/522* (2013.01); *H01L 24/02* (2013.01); *H01L 24/03* (2013.01); *H01L 24/05* (2013.01); *H01L 23/562* (2013.01); *H01L 24/11* (2013.01); *H01L 24/13* (2013.01); *H01L 2224/0239* (2013.01); *H01L 2224/02313* (2013.01); *H01L 2224/0345* (2013.01); *H01L 2224/0361* (2013.01); *H01L 2224/0392* (2013.01); *H01L 2224/03416* (2013.01); *H01L 2224/03452* (2013.01); *H01L 2224/05022* (2013.01); *H01L 2224/05024* (2013.01); *H01L 2224/05091* (2013.01); *H01L 2224/05147* (2013.01); *H01L 2224/05562* (2013.01); *H01L 2224/05567* (2013.01); *H01L 2224/05647* (2013.01); *H01L 2224/13022* (2013.01); *H01L 2224/13024* (2013.01);
(Continued)

(58) Field of Classification Search
CPC ............... H01L 23/481; H01L 27/1203; H01L 23/5383; H01L 23/5384; H01L 23/5385
USPC ................................ 257/750, 758, 759, 784
See application file for complete search history.

(56) References Cited

U.S. PATENT DOCUMENTS 7,361,993 B2 *  4/2008  Coolbaugh ............. H01L 24/11
                                                    257/737
7,652,378 B2 *  1/2010  Tseng ................ H01L 23/53223
                                                    257/758

(Continued)

*Primary Examiner* — S. V. Clark
(74) *Attorney, Agent, or Firm* — Cooper Legal Group, LLC

(57) ABSTRACT

A semiconductor arrangement and method of formation are provided. The semiconductor arrangement includes a metal trace under at least a first dielectric layer and a second dielectric layer. The metal trace is connected to a ball connection by a first via in the first dielectric layer and second via in the second dielectric layer. The metal trace is connected to a test pad at a connection point, where the connection point is under the first dielectric layer. The metal trace under at least the first dielectric layer and the second dielectric layer has increased stability and decreased susceptibility to cracking in least one of the ball connection, the connection point, the first via or the second via as compared to a metal trace that is not under at least a first dielectric layer and a second dielectric layer.

20 Claims, 10 Drawing Sheets

(51) Int. Cl.
*H01L 29/40* (2006.01)
*H01L 23/522* (2006.01)
*H01L 21/66* (2006.01)
*H01L 23/00* (2006.01)

(52) U.S. Cl.
CPC ............. *H01L 2224/13147* (2013.01); *H01L 2924/01029* (2013.01); *H01L 2924/20643* (2013.01)

(56) References Cited

U.S. PATENT DOCUMENTS

| | | | |
|---|---|---|---|
| 7,884,488 B2* | 2/2011 | Hedler | H01L 22/32 257/784 |
| 7,977,803 B2* | 7/2011 | Kuo | H01L 22/32 257/780 |
| 8,288,875 B2* | 10/2012 | Shimizu | H01L 21/4857 257/698 |
| 8,872,303 B2* | 10/2014 | Weng | H01L 21/76838 257/503 |
| 8,937,381 B1* | 1/2015 | Dunlap | H01L 23/3128 257/686 |
| 2011/0049515 A1* | 3/2011 | Kuo | H01L 22/32 257/48 |
| 2013/0127024 A1* | 5/2013 | Lin | H01L 21/76816 257/659 |

* cited by examiner

SEMICONDUCTOR ARRANGEMENT AND FORMATION THEREOF

BACKGROUND

In semiconductor arrangements various layers of conductive material are separated from one another by dielectric or non-conductive layers. Electrically conductive vias are formed within or through the dielectric layers to selectively connect different conductive layers to one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
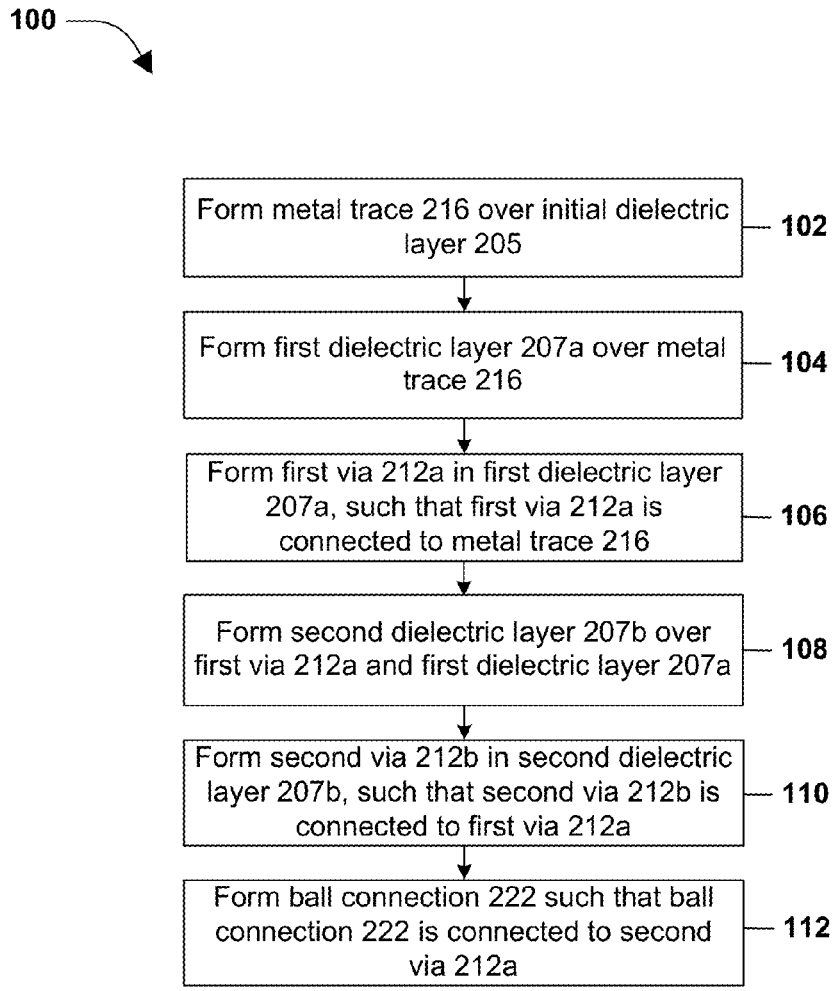
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 9:
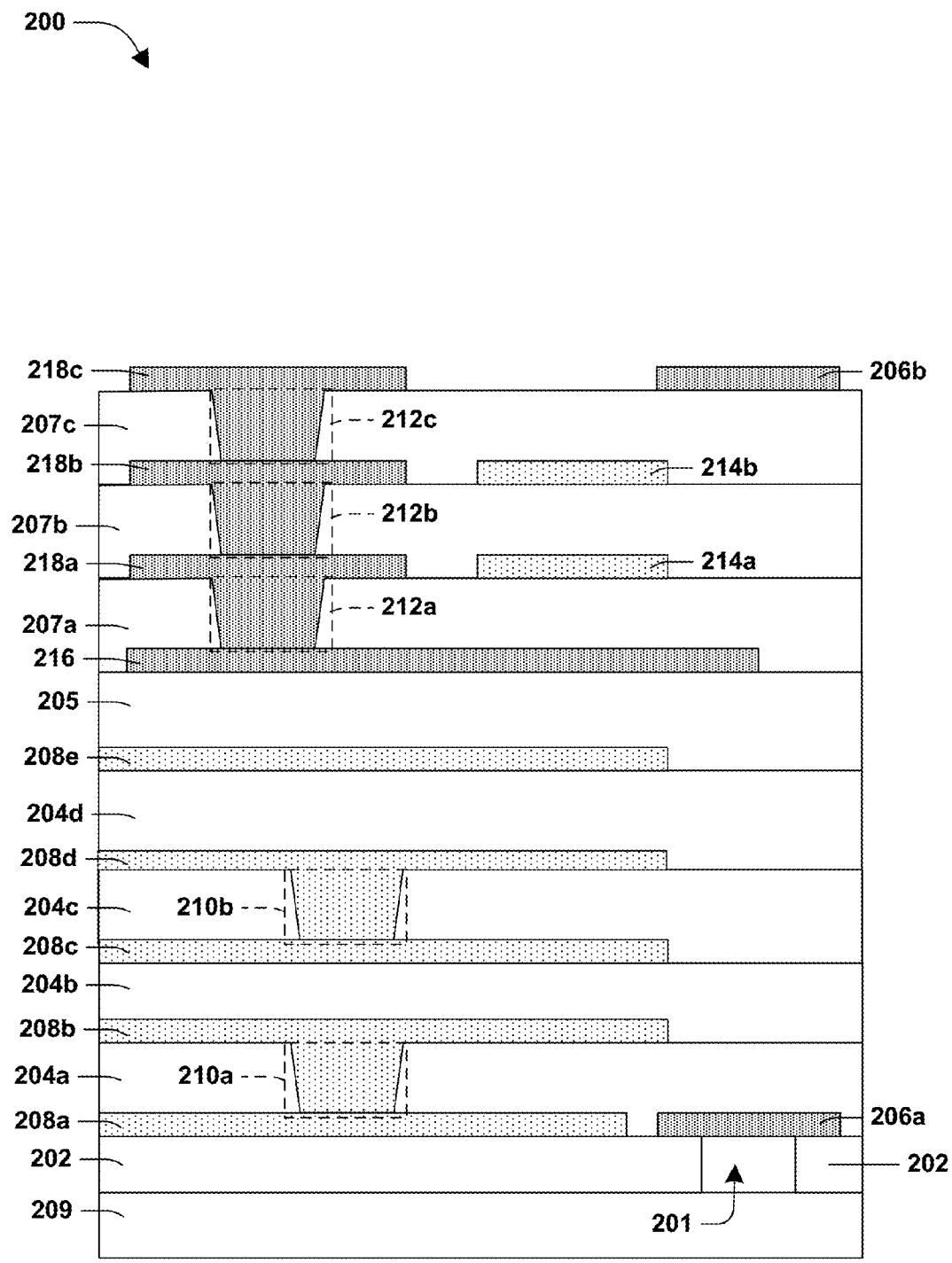
FIG. 9 is an illustration of a semiconductor arrangement, in accordance with some embodiments.
Figure 10:
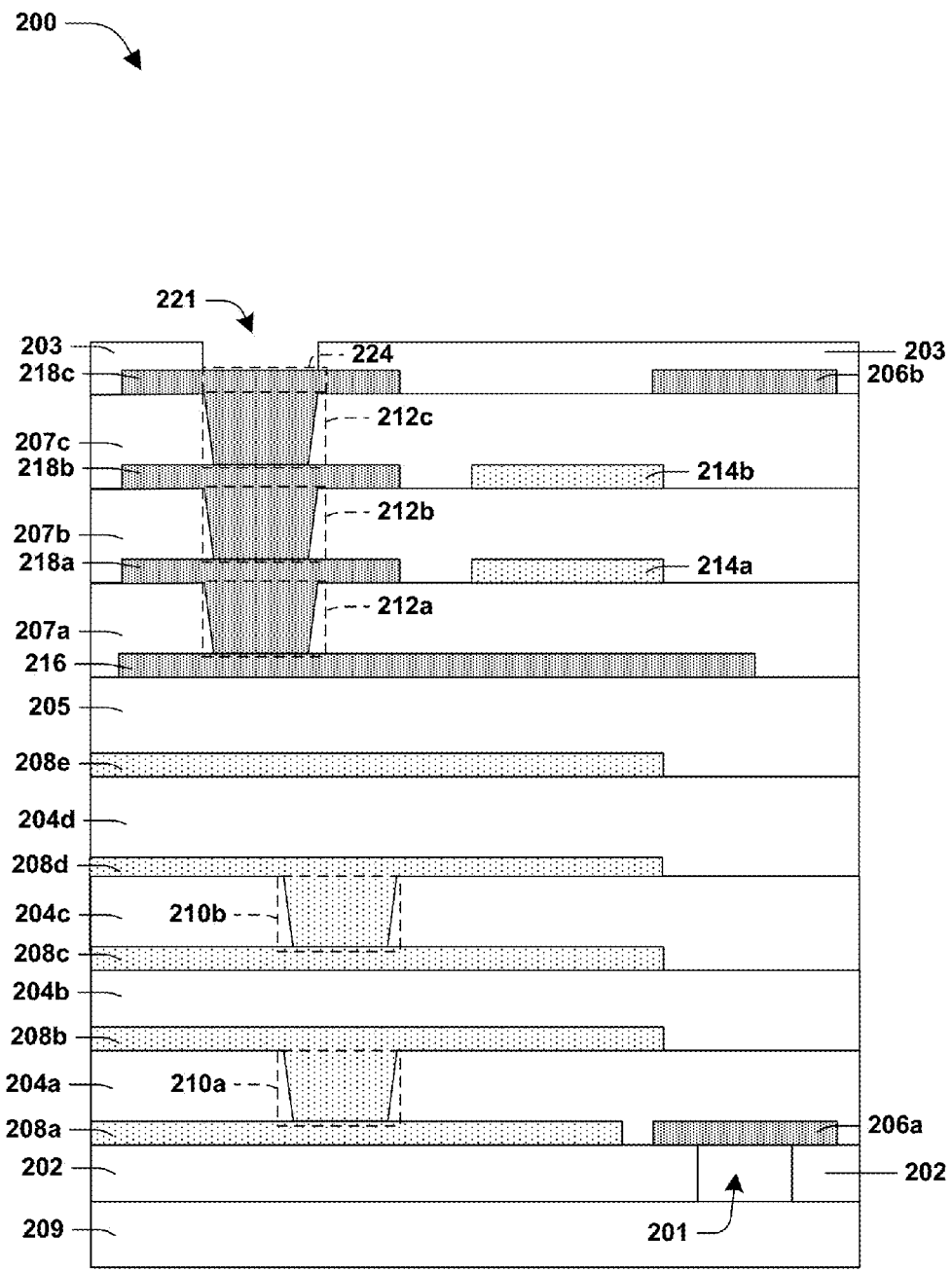
FIG. 10 is an illustration of a semiconductor arrangement, in accordance with some embodiments.
Figure 11:
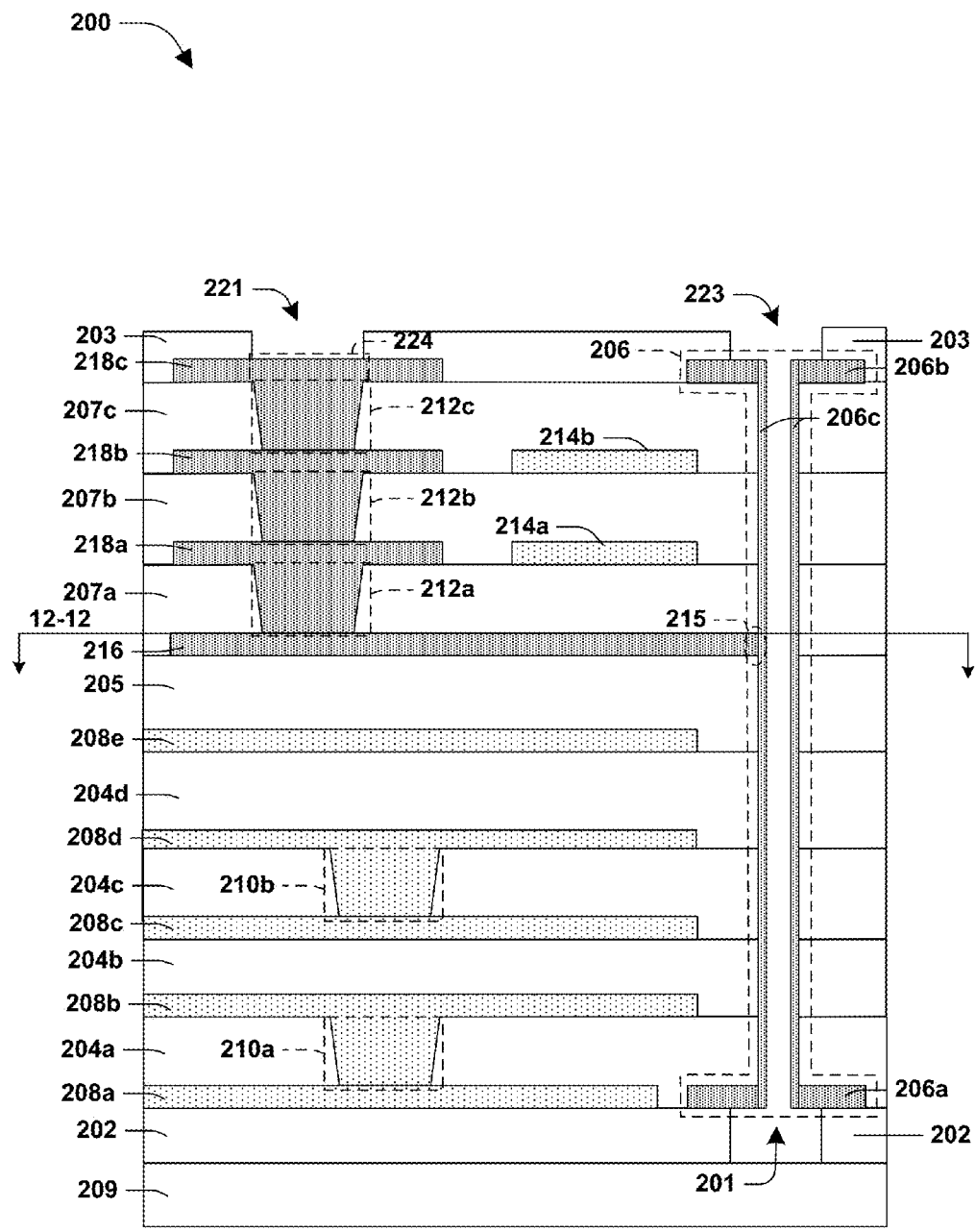
FIG. 11 is an illustration of a semiconductor arrangement, in accordance with some embodiments.
Figure 12:
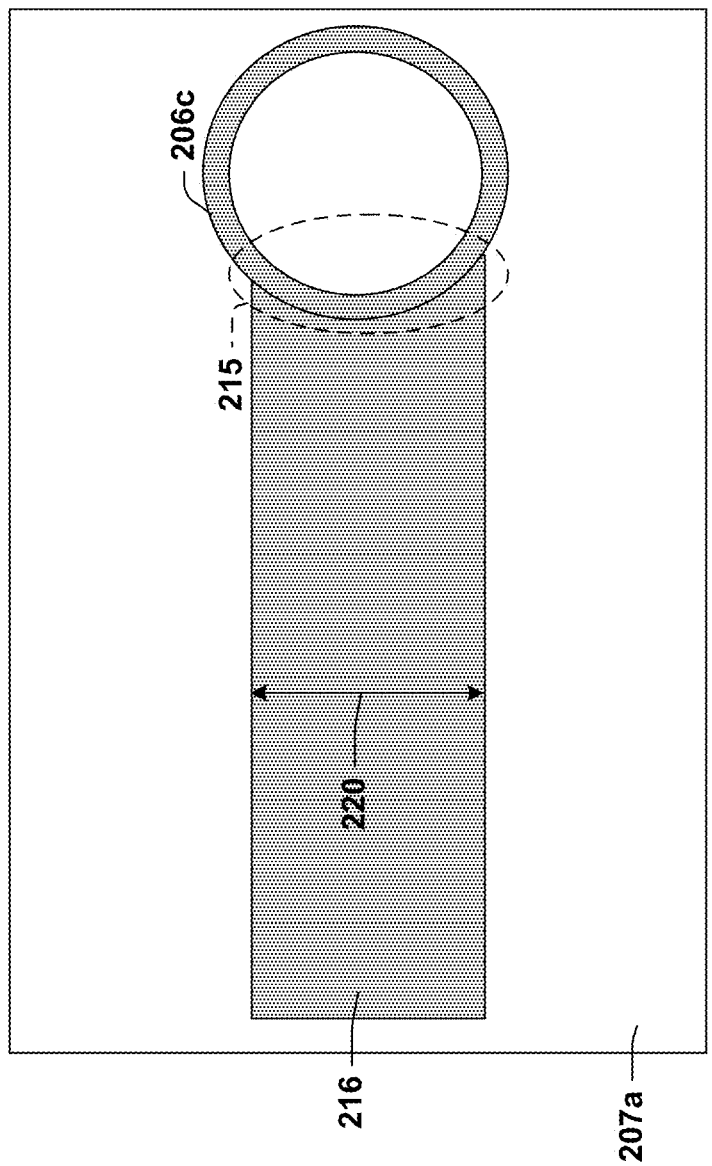
FIG. 12 is an illustration of a semiconductor arrangement, in accordance with some embodiments.
Figure 13:
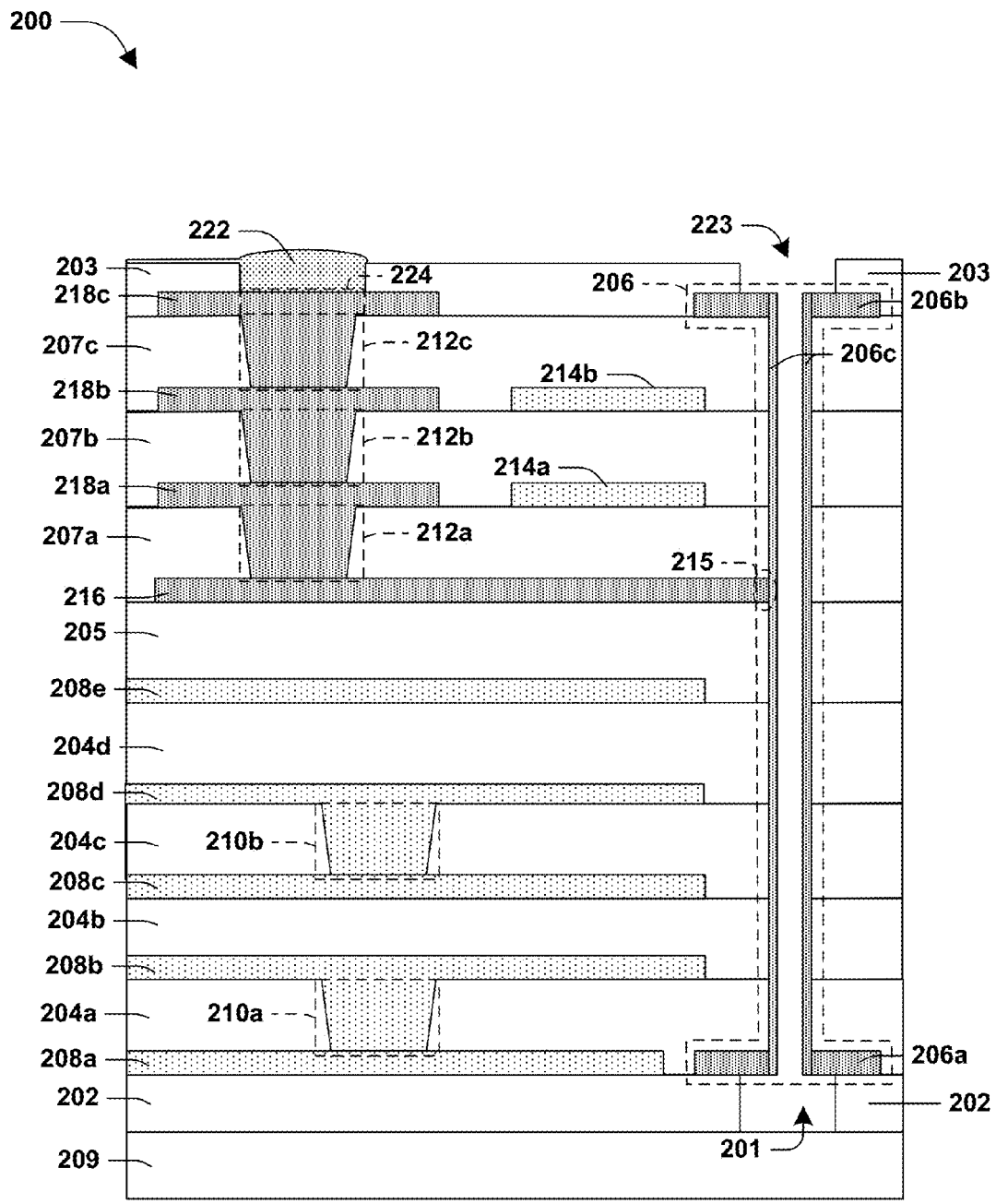
FIG. 13 is an illustration of a semiconductor arrangement, in accordance with some embodiments.

A method 100 of forming a semiconductor arrangement 200 is illustrated in FIG. 1, and one or more semiconductor arrangements formed by such methodology are illustrated in FIGS. 2-13. In some embodiments, such as illustrated in FIG. 13, the semiconductor arrangement 200 comprises a metal trace 216 under at least a portion of a first dielectric layer 207a and a second dielectric layer 207b. In some embodiments, a first via 212a in the first dielectric layer 207a is connected to the metal trace 216. In some embodiments, a second via 212b in the second dielectric layer 207b is connected to the first via 212a and to a ball connection 222, where the ball connection 222 is over the second dielectric layer 207b. In some embodiments, the first via 212a is connected to the second via 212b by a first metal layer 218a. In some embodiments, a third via 212c in a third dielectric layer 207c connects the second via 212b to the ball connection 222. In some embodiments, the third via 212c is connected to the second via 212b by a second metal layer 218b. In some embodiments, the ball connection 222 is connected to the second via 212b by a ball pad 224 in a ball connection opening 221, as illustrated in FIG. 11, defined within a top photoresist 203. In some embodiments, the ball pad 224 comprises a portion of a top metal layer, such as the second metal layer 218b, where the second metal layer 218b is exposed by the ball connection opening 221, or a third metal layer 218c, where the third metal layer 218c is exposed by the ball connection opening 221. In some embodiments, the metal trace 216 is connected to a test pad 206 at a connection point 215, the connection point 215 under the portion of the first dielectric layer 207a. In some embodiments, the metal trace 216 has a metal trace width 220, as illustrated in FIG. 12, where FIG. 12 is a cross sectional view taken along line 12-12 in FIG. 11. In some embodiments, the metal trace width 220 is between about 300μm to about 400μm. In some embodiments, the metal trace 216 under at least the portion of the first dielectric layer 207a and the second dielectric layer 207b has increased stability and decreased propensity for cracking in least one of the ball connection 222, the connection point 215, the first via 212a or the second via 212b as compared to a metal trace that is not under at least a portion of a first dielectric layer and a second dielectric layer. In some embodiments, the metal trace 216 having the metal trace width 220 has increased stability and decreased propensity for cracking as compared to a metal trace having a metal trace width less the metal trace width 220. According to some embodiments, additional dielectric layers, vias and metal layers are situated between the metal trace 216 and the ball pad 224.

Figure 2:
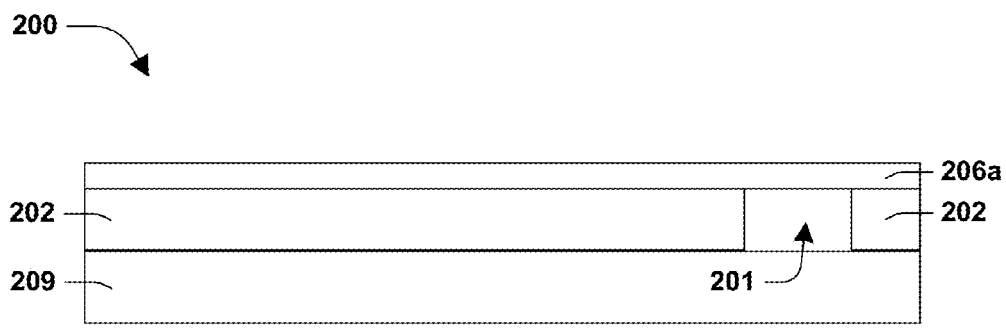
FIG. 2 is an illustration of a semiconductor arrangement, in accordance with some embodiments.
Figure 7:
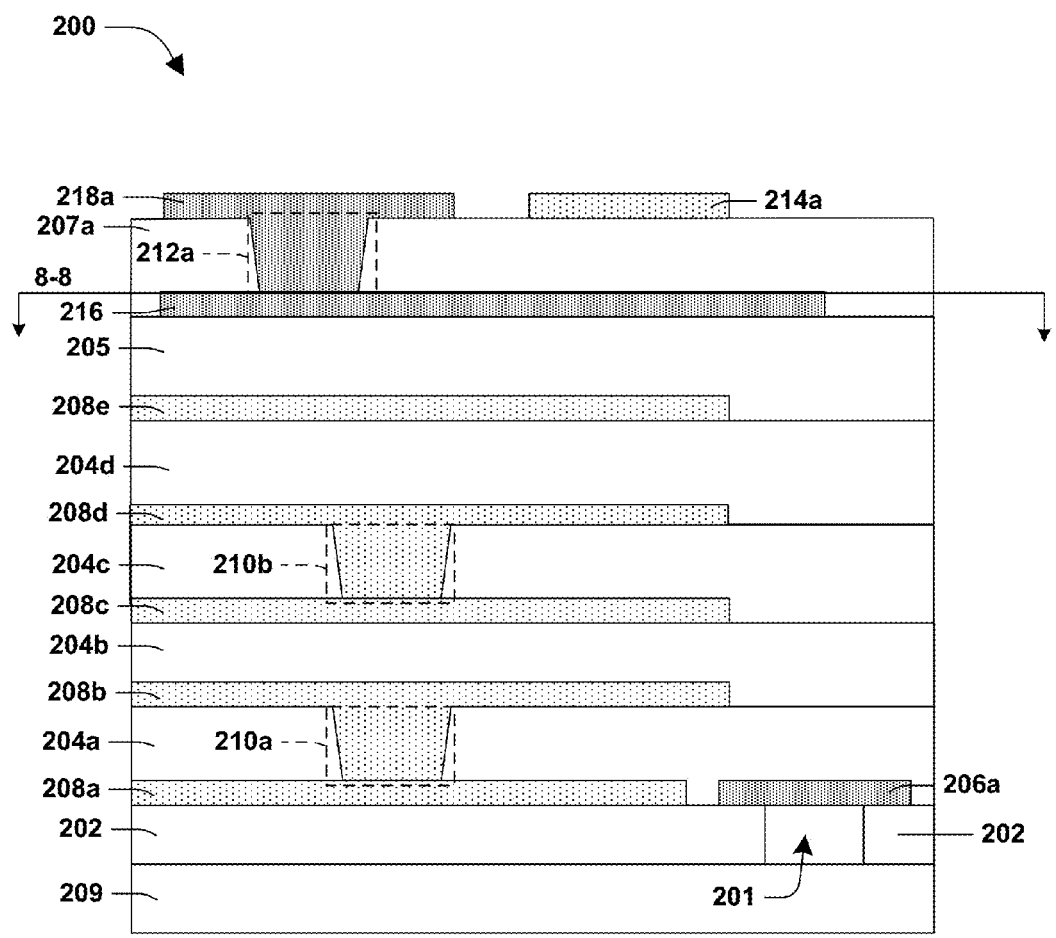
FIG. 7 is an illustration of a semiconductor arrangement, in accordance with some embodiments.

At 102 of method 100, as illustrated in FIG. 7, the metal trace 216 is formed over an initial dielectric layer 205, according to some embodiments. Turning to FIG. 2, a lower test metal layer 206a is formed over a bottom photoresist 202, the bottom photoresist 202 over a substrate 209.

Figure 3:
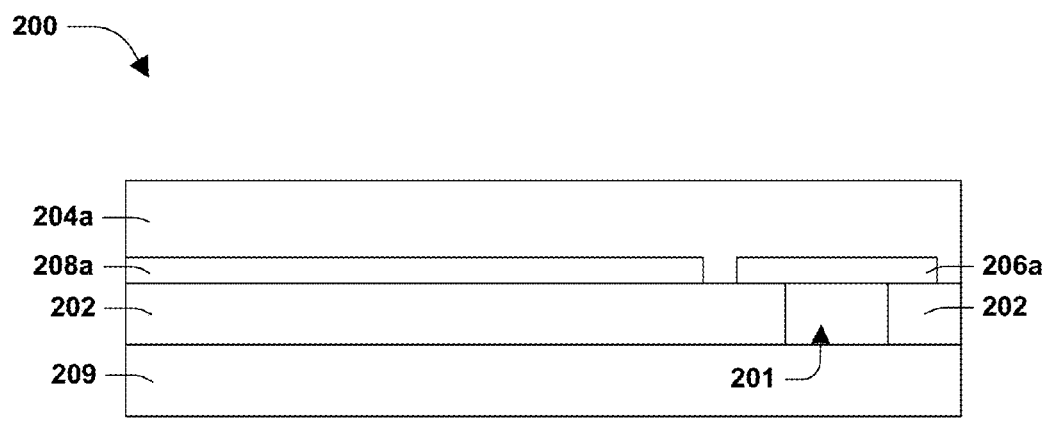
FIG. 3 is an illustration of a semiconductor arrangement, in accordance with some embodiments.
Figure 4:
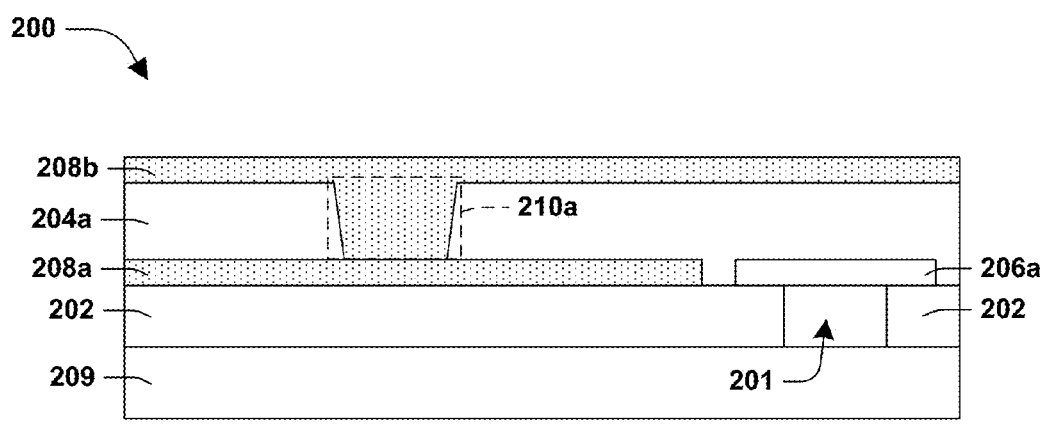
FIG. 4 is an illustration of a semiconductor arrangement, in accordance with some embodiments.
Figure 5:
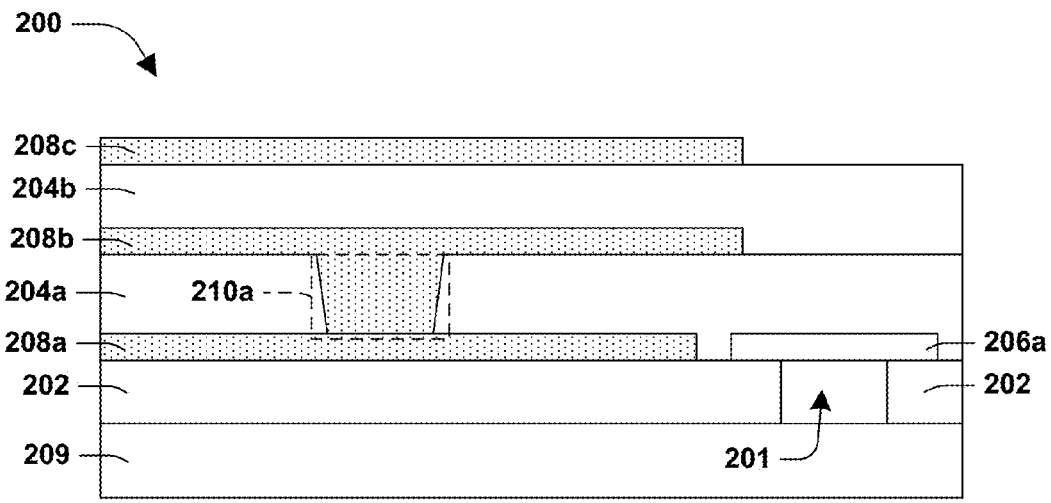
FIG. 5 is an illustration of a semiconductor arrangement, in accordance with some embodiments.
Figure 6:
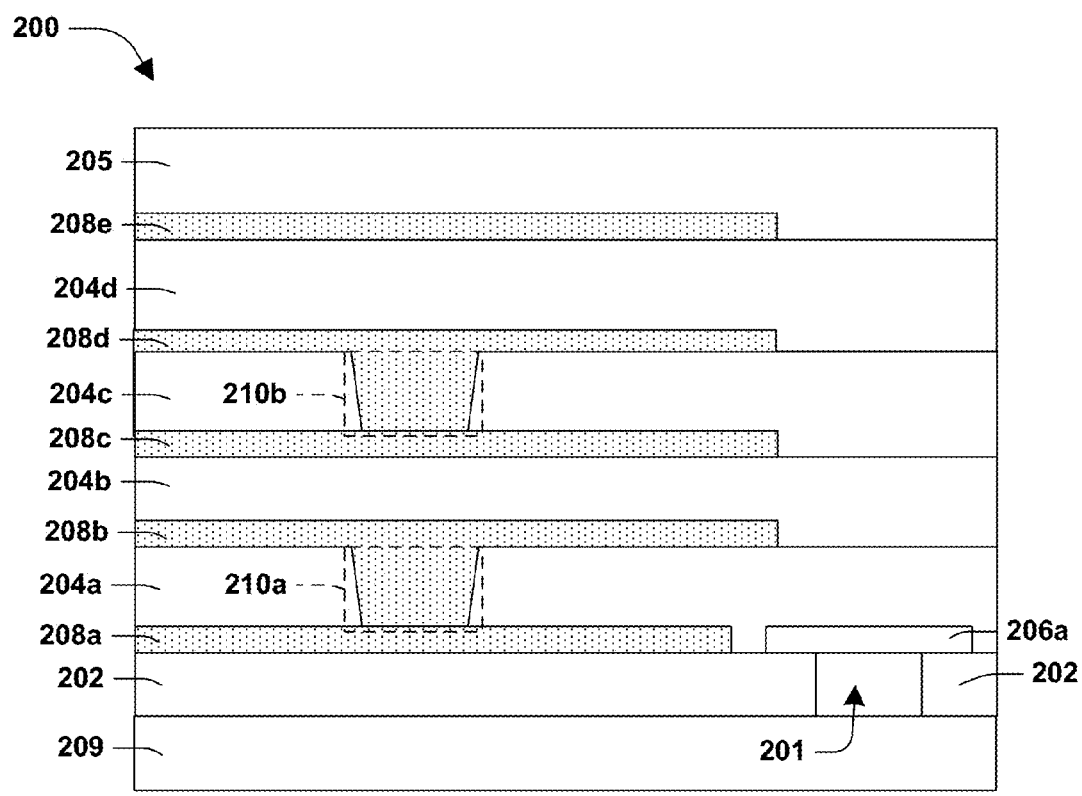
FIG. 6 is an illustration of a semiconductor arrangement, in accordance with some embodiments.
Figure 8:
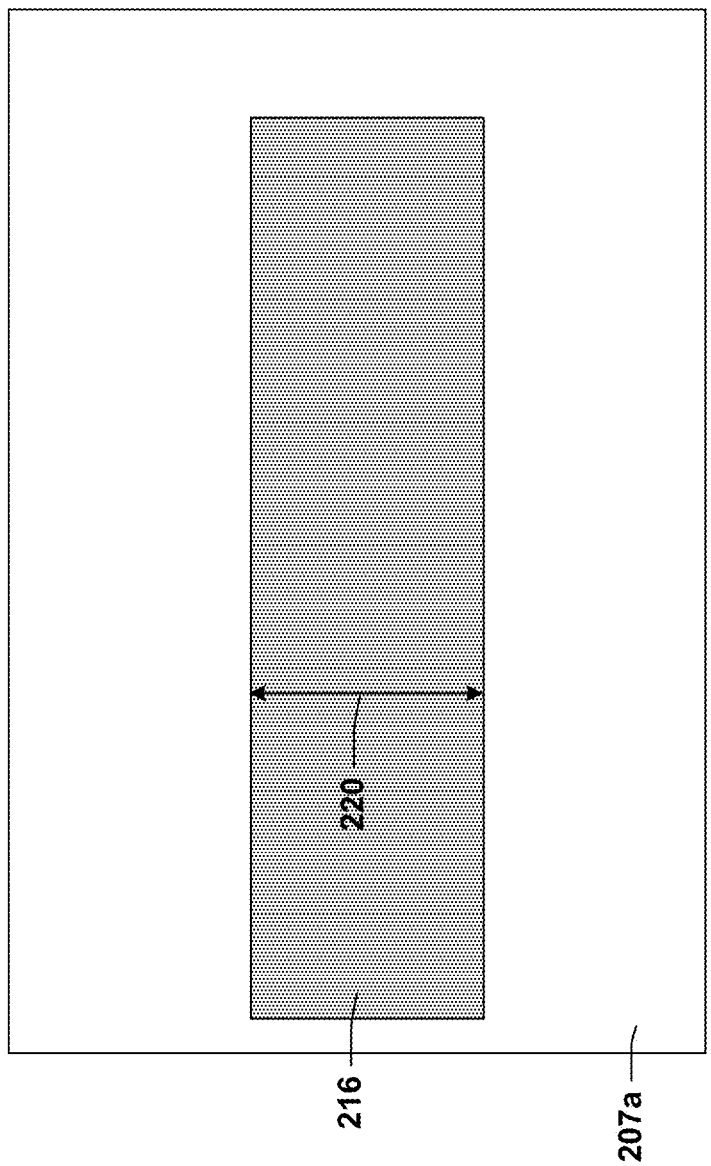
FIG. 8 is an illustration of a semiconductor arrangement, in accordance with some embodiments.

According to some embodiments, the substrate 209 comprises at least one of an epitaxial layer, a silicon-on-insulator (SOI) structure, a wafer, or a die formed from a wafer. In some embodiments, the substrate 209 comprises silicon. In some embodiments, the bottom photoresist 202 defines a bottom photoresist opening 201. In some embodiments, the lower test metal layer 206a comprises a metal, such as copper. In some embodiments, such as illustrated in FIG. 3, the lower test metal layer 206a is patterned, such that the lower test metal layer 206a is over the bottom photoresist opening 201. In some embodiments, a first lower metal layer 208a is formed over the bottom photoresist 202 adjacent the lower test metal layer 206a. In some embodiments, the first lower metal layer 208a is formed by masking the lower test metal layer 206a and depositing the first lower metal layer 208a. In some embodiments, a first lower dielectric layer 204a is formed over the lower test metal layer 206a and the first lower metal layer 208a. In some embodiments, the first lower dielectric layer 204a comprises at least one of an oxide or a nitride. In some embodiments, the first lower dielectric layer 204a is formed by deposition. In some embodiments, such as illustrated in FIG. 4, a first lower via opening is formed in the first lower dielectric layer 204a, such that the first lower via opening exposes a top surface of the first lower metal layer 208a. In some embodiments, a first lower via 210a is formed in the first lower via opening and a second lower metal layer 208b is formed over the first lower dielectric layer 204a and the first lower via 210a. In some embodiments, the first lower via 210a and the second lower metal layer 208b are formed by deposition. In some embodiments, the first lower via 210a and the second lower metal layer 208b comprise metal, such as by copper. In some embodiments, such as illustrated in FIG. 5, the second lower metal layer 208b is patterned, such that the second lower metal layer 208b is over a portion of the first lower dielectric layer 204a, such as a portion that is not over the lower test metal layer 206a. In some embodiments, a second lower dielectric layer 204b is formed over the second lower metal layer 208b. In some embodiments, the second lower dielectric layer 204b comprises at least one of an oxide or a nitride. In some embodiments, the second lower dielectric layer 204b is formed by deposition. In some embodiments, a third lower metal layer 208c is formed over the second lower dielectric layer 204b. In some embodiments, the third lower metal layer 208c is formed by deposition. In some embodiments, the third lower metal layer 208c comprise metal, such as by copper. In some embodiments, the third lower metal layer 208c is patterned, such that the third lower metal layer 208c is over a portion of the second lower dielectric layer 204b, such as a portion that is not over the lower test metal layer 206a. In some embodiments, such as illustrated in FIG. 6, a third lower dielectric layer 204c is formed in the same manner as described above with regard to the second lower dielectric layer 204b, as illustrated in FIG. 5. In some embodiments, a second lower via opening is formed in the third lower dielectric layer 204c, as described above with regard to the first lower via opening, as illustrated in FIG. 4. In some embodiments, a second lower via 210b is formed in the second lower via opening and a fourth lower metal layer 208d is formed over the third lower dielectric layer 204c and the second lower via 210b in the same manner as described above with regards to the first lower via 210a and the second lower metal layer 208b, as illustrated in 4. In some embodiments, a fourth lower dielectric layer 204d is formed over the fourth lower metal layer 208d. In some embodiments, the fourth lower dielectric layer 204d is formed in the same manner as described above with regard to the second lower dielectric layer 204b, as illustrated in FIG. 5. In some embodiments, a fifth lower metal layer 208e is formed over the fourth lower dielectric layer 204d in the same manner as described above with regards to the third lower metal layer 208c, as illustrated in FIG. 5. In some embodiments, multiple lower dielectric layers, multiple lower metal layers and multiple lower metal vias having the same composition as the first lower via 210a, the second lower metal layer 208b, the first lower dielectric layer 204a, the second lower dielectric layer 204b and the third lower metal layer 208c, as illustrated in FIG. 6, are contemplated. In some embodiments, the initial dielectric layer 205 is formed over the fifth lower metal layer 208e. In some embodiments, the initial dielectric layer 205 comprises at least one of an oxide or a nitride. In some embodiments, the initial dielectric layer 205 is formed by deposition. In some embodiments, as illustrated in FIG. 7, the metal trace 216 is formed over the initial dielectric layer 205. In some embodiments, the metal trace 216 is formed by deposition. In some embodiments, the metal trace 216 comprises a metal, such as copper. In some embodiments, the metal trace 216 is patterned such that the metal trace 216 is over the bottom photoresist opening 201. In some embodiments, as illustrated in FIG. 8, which illustrates a cross sectional view taken along line 8-8 in FIG. 7, the metal trace 216 has the metal trace width 220 between about 300 μm to about 400 μm.

At 104 of method 100, as illustrated in FIG. 7, the first dielectric layer 207a is formed over the metal trace 216, according to some embodiments. In some embodiments, the first dielectric layer 207a comprises at least one of an oxide or a nitride. In some embodiments, the first dielectric layer 207a is formed by deposition. In some embodiments, a first via opening is formed in the first dielectric layer 207a, such that the first via opening exposes a top surface of the metal trace 216.

At 106 of method 100, as illustrated in FIG. 7, the first via 212a is formed in the first dielectric layer 207a, such that the first via 212a is connected to the metal trace 216, according to some embodiments. In some embodiments, the first via 212a is formed in the first via opening and the first metal layer 218a is formed over the first dielectric layer 207a and the first via 212a. In some embodiments, the first via 212a and the first metal layer 218a are formed by deposition. In some embodiments, the first via 212a and the first metal layer 218a comprise metal, such as by copper. In some embodiments, the first metal layer 218a is patterned, such that the first metal layer 218a is over a portion of the first dielectric layer 207a, such as a portion that is not over the lower test metal layer 206a. In some embodiments, a first upper metal layer 214a is formed over the first dielectric layer 207a adjacent the first metal layer 218a. In some embodiments, the first upper metal layer 214a is formed by masking the first metal layer 218a and depositing the first upper metal layer 214a. In some embodiments, the first upper metal layer 214a comprises metal, such as copper.

At 108 of method 100, as illustrated in FIG. 9, the second dielectric layer 207b is formed over the first via 212a and the first dielectric layer 207a, according to some embodiments. In some embodiments, the second dielectric layer 207b is formed over the first metal layer 218a and the first upper metal layer 214a. In some embodiments, the second dielectric layer 207b is formed in the same manner as described above with regards to the first dielectric layer 207a, as illustrated in FIG. 7. In some embodiments, a second via opening is formed in the second dielectric layer 207b in the same manner as described above with regards to the first via opening, as illustrated in FIG. 7.

At 110 of method 100, as illustrated in FIG. 9, the second via 212b is formed in the second dielectric layer 207b, such that the second via 212b is connected to the first via 212a, according to some embodiments. In some embodiments, the second via 212b is formed in the second via opening and the second metal layer 218b is formed over the second dielectric layer 207b and the second via 212b. In some embodiments, a second upper metal layer 214b is formed adjacent the second metal layer 218b. In some embodiments, the second via 212b, the second metal layer 218b and the second upper metal layer 214b are formed in the same manner as described above with regards to the first via 212a, the first metal layer 218a and the first upper metal layer 214a, as illustrated FIG. 7. In some embodiments, additional dielectric layers, vias and metal layers are formed, such as the third via 212c in the third dielectric layer 207c, where the third via 212c connects the second via 212b through the second metal layer 218b to the third metal layer 218c. In some embodiments, the third via 212c and the third metal layer 218c are formed in the same manner as described above with regards to the first via 212a and the first metal layer 218a, as illustrated FIG. 7. In some embodiments, an upper test metal layer 206b is formed on an upper most top dielectric layer, such as the third dielectric layer 207c, and over the lower test metal layer 206a. In some embodiments, the upper test metal layer 206b comprises a metal, such as copper. In some embodiments, the upper test metal layer 206b is formed by masking an upper most metal layer, such as the third metal layer 218c and depositing the upper test metal layer 206b. In some embodiments, such as illustrated in FIG. 10, the top photoresist 203 is formed over the third metal layer 218c, the third dielectric layer 207c, and the upper test metal layer 206b. In some embodiments, the ball connection opening 221 is formed within or defined by the top photoresist 203, such that a top surface of the third metal layer 218c exposed, where the top surface of the third metal layer 218c that is exposed comprises the ball pad 224. In some embodiments, such as illustrated in FIG. 11, a top photoresist test opening is formed over the upper test metal layer 206b. In some embodiments, a test pad opening 223 is formed through and defined by at least one of the upper test metal layer 206b, the third dielectric layer 207c, the second dielectric layer 207b, the first dielectric layer 207b, the metal trace 216, the initial dielectric layer 205, the fourth lower dielectric layer 204d, the third lower dielectric layer 204c, the second lower dielectric layer 204b, the first lower dielectric layer 204a, or the lower test metal layer 206a. In some embodiments, a test pad metal layer 206c is formed on sidewalls of the test pad opening 223. In some embodiments, the test pad metal layer 206c is formed by electro-chemical plating. In some embodiments, the test pad 206 comprises the lower test metal layer 206a, the upper test metal layer 206b and the test pad metal layer 206c. In some embodiments, the test pad 206 comprises a metal, such as copper. In some embodiments, as illustrated in FIGS. 11 and 12, where FIG. 12 is a cross sectional view taken along line 12-12 in FIG. 11, the test pad metal layer 206c is formed such that the metal trace 216 is connected to the test pad 206 at the connection point 215, the connection point 215 under the portion of the first dielectric layer 207a.

At 112 of method 100, as illustrated in FIG. 13, the ball connection 222 is formed, such that the ball connection 222 is connected to the second via 212a, according to some embodiments. In some embodiments, the ball connection 222 is formed in the ball connection opening 221, such that the second via 212a is connected to the ball connection 222 by the second metal layer 218b, the third via 212c and the ball pad 224. In some embodiments, the ball connection 222 comprises a metal, such as copper. In some embodiments, the ball connection 222 connects the metal trace 216 to a device, such as a component of a mobile device. In some embodiments, the metal trace 216 under at least the portion of the first dielectric layer 207a and the second dielectric layer 207b has increased stability or structural integrity and decreased propensity or susceptibility for cracking, fracturing, failing, etc. in at least one of the ball connection 222, the connection point 215, the first via 212a or the second via 212b as compared to a metal trace that is not under at least a portion of a first dielectric layer and a second dielectric layer. In some embodiments, the metal trace 216 having the metal trace width 220 has increased stability or structural integrity and decreased propensity or susceptibility for cracking, fracturing, failing, etc. as compared to a metal trace having a metal trace width less the metal trace width 220.

According to some embodiments, a semiconductor arrangement comprises a metal trace under at least a portion of a first dielectric layer and a second dielectric layer, a first via in the first dielectric layer connected to the metal trace and a second via in the second dielectric layer connected to the first via and to a ball connection. In some embodiments, the ball connection is over the second dielectric layer.

According to some embodiments, a method of forming a semiconductor arrangement comprises forming a metal trace over an initial dielectric layer, forming a first dielectric layer over the metal trace and forming a first via in the first dielectric layer, such that the first via is connected to the metal trace. According to some embodiments, the method of forming a semiconductor arrangement comprises forming a second dielectric layer over the first via and the first dielectric layer, forming a second via in the second dielectric layer, such that the second via is connected to the first via and forming a ball connection connected to the second via.

According to some embodiments, a semiconductor arrangement comprises a metal trace having a metal trace width between about 300µm to about 400µm under at least a portion of a first dielectric layer and a second dielectric layer, a first via in the first dielectric layer connected to the metal trace and a second via in the second dielectric layer connected to the first via and to a ball connection. In some embodiments, the ball connection is over the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
    a metal trace under at least:
        a portion of a first dielectric layer, and
        a second dielectric layer;
    a first via in the first dielectric layer coupled to the metal trace;
    a second via in the second dielectric layer, wherein:
        the second via is coupled to the first via and to a solder bump connector, and
        the solder bump connector is over the second dielectric layer;
    an opening extending through the first dielectric layer and the second dielectric layer; and
    a test pad comprising:
        an upper test metal overlying the first dielectric layer and the second dielectric layer; and
        a test pad metal layer lining the opening and extending from the upper test metal through the portion of the first dielectric layer and the second dielectric layer, wherein:
            the metal trace is in contact with a sidewall of the test pad metal layer at a connection point, and
            the connection point is under the portion of the first dielectric layer.

2. The semiconductor arrangement of claim 1, the metal trace having a metal trace width between about 300 µm to about 400 µm.

3. The semiconductor arrangement of claim 1, the metal trace comprising copper.

4. The semiconductor arrangement of claim 1, the solder bump connector coupled to the second via by a solder bump connector pad in a solder bump connector opening defined within a top photoresist.

5. The semiconductor arrangement of claim 1, the first via coupled to the second via by a first metal layer.

6. The semiconductor arrangement of claim 1, comprising a third via in a third dielectric layer, wherein:
    the third via is coupled to the second via and to the solder bump connector, and
    the solder bump connector is coupled to the second via by way of the third via.

7. The semiconductor arrangement of claim 6, at least one of the first dielectric layer, the second dielectric layer or the third dielectric layer comprising at least one of an oxide or a nitride.

8. The semiconductor arrangement of claim 6, at least one of the first via, the second via or the third via comprising copper.

9. A semiconductor arrangement comprising:
    a metal trace having a metal trace width between about 300 µm to about 400 µm under at least:
        a portion of a first dielectric layer, and
        a second dielectric layer;
    a first via in the first dielectric layer coupled to the metal trace;
    a second via in the second dielectric layer coupled to the first via and to a solder bump connector, wherein the solder bump connector is over the second dielectric layer;
    an opening extending through the first dielectric layer and the second dielectric layer; and
    a test pad comprising:
        an upper test metal overlying the first dielectric layer and the second dielectric layer; and
        a test pad metal layer in the opening and extending from the upper test metal through the portion of the first dielectric layer and the second dielectric layer, wherein the metal trace is in contact with a sidewall of the test pad metal layer.

10. The semiconductor arrangement of claim 9, the test pad comprising:
    a lower test metal underlying the first dielectric layer, wherein the test pad metal layer extends from the upper test metal to the lower test metal.

11. The semiconductor arrangement of claim 9, the first via coupled to the second via by a first metal layer.

12. The semiconductor arrangement of claim 9, at least one of the first dielectric layer or the second dielectric layer comprising at least one of an oxide or a nitride.

13. A semiconductor arrangement comprising:
a plurality of dielectric layers;
an opening extending through the plurality of dielectric layers;
a test pad comprising:
an upper test metal in contact with a top dielectric layer of the plurality of dielectric layers;
a lower test metal in contact with a bottom dielectric layer of the plurality of dielectric layers; and
a test pad metal layer lining the opening and extending between the upper test metal and the lower test metal;
a metal trace disposed between a first set of the plurality of dielectric layers and a second set of the plurality of dielectric layers, the metal trace in contact with a sidewall of the test pad metal layer; and
a first via extending through a first dielectric layer of the first set and in contact with the metal trace.

14. The semiconductor arrangement of claim 13, comprising a second via extending through a second dielectric layer of the first set, the second via overlying the first via.

15. The semiconductor arrangement of claim 14, comprising a metal layer comprising a top surface in contact with the second via and a bottom surface in contact with the first via.

16. The semiconductor arrangement of claim 15, comprising an upper metal layer laterally co-planar with the metal layer, the upper metal layer separated from the metal layer by a second dielectric layer of the first set.

17. The semiconductor arrangement of claim 16, the upper metal layer between the metal layer and the test pad metal layer.

18. The semiconductor arrangement of claim 14, comprising a solder bump connector overlying the second via, the second via coupling the solder bump connector to the first via.

19. The semiconductor arrangement of claim 9, comprising a third via in a third dielectric layer, wherein:
the third via is coupled to the second via and to the solder bump connector, and
the solder bump connector is coupled to the second via by way of the third via.

20. The semiconductor arrangement of claim 1, wherein the metal trace is in contact with a bottom surface and a sidewall of the first dielectric layer.

* * * * *